United States Patent [19]

Behrent

[11] Patent Number: 5,850,598
[45] Date of Patent: Dec. 15, 1998

[54] HOMODYNE RECEIVER AND PROCESS FOR DIRECT CONVERSION

[75] Inventor: Hermann Behrent, Kuddewoerde, Germany

[73] Assignee: Sican Gesellschaft fur Silizium-Anwendungen und Cad/Cat, Germany

[21] Appl. No.: 256,106

[22] PCT Filed: Oct. 29, 1993

[86] PCT No.: PCT/DE93/01035

§ 371 Date: Sep. 22, 1994

§ 102(e) Date: Sep. 22, 1994

[87] PCT Pub. No.: WO94/10757

PCT Pub. Date: May 11, 1994

[30] Foreign Application Priority Data

Oct. 29, 1992 [DE] Germany ............ 42 36 546.5

[51] Int. Cl.[6] .................................. H04B 1/30
[52] U.S. Cl. ................ 455/324; 455/307; 455/310
[58] Field of Search .................. 455/324, 316, 455/102, 208, 33.1, 33.2, 281, 289, 302, 310, 307, 295, 296, 317

[56] References Cited

U.S. PATENT DOCUMENTS

| | | |
|---|---|---|
| 4,653,117 | 3/1987 | Heck .................................. 455/209 |
| 4,736,390 | 4/1988 | Ward et al. ....................... 455/324 |
| 4,766,392 | 8/1988 | Moore .............................. 455/324 |
| 4,944,025 | 7/1990 | Gehring et al. .................. 455/316 |

*Primary Examiner*—Edward F. Urban
*Assistant Examiner*—Lee Nguyen
*Attorney, Agent, or Firm*—Stein, Schifino & Van Der Wall

[57] ABSTRACT

The invention pertains to a homodyne receiver and a process for direct conversion of angle-modulated carrier signals, especially those that have a d.c.-voltage component in the converted signal (IF). With many types of-modulation the (short-time) d.c. component of the conversion signal contains information about the modulating signal. Additional d.c. offsets are usually separated out by using a bandpass for the IF signal. In the process, however, the information-containing d.c. components of the converted signal are lost; as a result the demodulated signal is disturbed and in particular the distortion factor is raised. To avoid this the invention provides that the local oscillator for generating inphase and quadrature signals has a frequency offset from the carrier frequency of the receiver signal so that the frequency differential between carrier and frequency and oscillator frequency is in the transmission band of the bandpass used to suppress undesirable mixes, carrier reminders and d.c. offsets.

4 Claims, 1 Drawing Sheet

HOMODYNE RECEIVER AND PROCESS FOR DIRECT CONVERSION

BACKGROUND OF THE INVENTION

1. Field of the Invention

The invention relates to a homodyne receiver and to a process for direct conversion (Direct Conversion Receiver), especially of angle-modulated carrier signals, specifically including those in which the converted signal (IF) exhibits a direct voltage component (DC component).

2. Description of the Related Art

Direct Conversion Receivers are known for example from DE 29 02 952 C2. According to this, it is theoretically sufficient to mix the received signal, if required after a preamplification, with the carrier frequency generated by a local oscillator and to separate off any high sum frequencies which arise in this case using a lowpass filter. The filtered signal is intended to correspond to the demodulated signal. The frequency of the local oscillator is intended to be set in a Phase-Locked Loop (PLL) to the carrier frequency. The PLL for frequency and phase locking is required because when using customary reference signal sources there is in principle a relatively large or small frequency offset in relation to the carrier frequency. The synchronization of the local oscillator with the carrier frequency or respectively the frequency If the emitting oscillator must therefore first be forced. To this end, the received carrier is utilized as reference signal for the locking. The error signal used for controlling the local oscillator cannot, if the received signal is very weak and is disturbed on the transmission path, be distinguished from the DC offset arising in the case of the direct conversion of the modulated carrier signal. The PLL locking then fails.

According to GB 2 192 506 the angle-modulated input signal is split into two branches and the frequency of a local oscillator is mixed with the two branches; in this case, a phase shift of the mixed-in frequency of 90° is set for one branch. The mixed signal in the branch without any phase shift is named the in-phase signal (I), and the mixed signal in the branch with phase shift is named the quadrature signal (Q). Lowpass filters and analog/digital converters are provided. The digital signals from both branches are passed to a digital signal processor (DSP). In the latter, the demodulated signal is calculated from the I and Q signals. The I and Q signals also exhibit a DC offset originating from the direct conversion of the modulated carrier signal. Further undesired DC offsets may arise on account of the crosstalk of the local oscillator onto the signal inputs of the mixer and on account of the relative phase relation of the local oscillator to the carrier of the received signal. Any amplifiers which may be inserted if required likewise lead to a further DC offset. The total sum of the DC offset voltages resulting from operating temperature, the aging of the components, phase relation, crosstalk, amplifier offset) may be, in the case of very small input signals, several tens of thousands of times larger than the useful signal, so that an AD converter must have a large dynamic range in order to be able still to resolve the useful signal. Thus, taking in account the required resolution of the useful signal the use of more economic and faster AD converters is substantially ruled out.

For heterodyne receivers, the use of a bandpass filter for the IF signal was proposed for example in WO 88/10033. By this means, all DC components are separated. However, along with the separated DC components, DC components of the converted signal are also separated by the bandpass filters. In the case of many types of modulation, the (short term) DC component of the converted signal contains information on the modulating signal. Along with the separating of the DC component of the converted signal, information on the modulating signal is also accordingly lost, consequently a considerable disturbance of the demodulated signal takes place. In particular, the nonlinear distortion factor is increased.

EP 0 437 373 A2 relates to a calibration device for homodyne receivers. In this case it is provided, inter alia, to provide in the signal branches for I and Q signals lowpass filters for the suppression of undesired mixing products and carrier residues. In the case of the use of lowpass filters alone, extremely costly AD converters with a large bit length would be required.

According to US 49 44 025, a specific receiver is provided, which, seen in precise terms, can no longer be designated as a homodyne receiver. Rather, an intermediate frequency is generated by the mixing in of the frequency $f_{up}$. Using an error amplifier, a regulation of the frequency of the local oscillator ($f_{offset}$) is derived from this intermediate frequency. Quite apart from the fact that in this case a regulation is used, which exhibits the known disadvantages, such as self-oscillation behavior of the regulation, in this case it is provided to drive the local oscillator for the generation of the I and Q signals with a frequency offset ($f_{offset}$). For this frequency offset it is provided that it is to be greater than one half of the channel width (base band width). This requires either mirror frequency selection, or the spectrum which is per se utilizable cannot fully be used. Especially in the case of narrow channel spacings, interference between neighboring channels is unavoidable.

SUMMARY OF THE INVENTION

The object of the invention is to specify a homodyne receiver and a process for the direct conversion of an especially angle-modulated carrier signal, in which on the one hand component-related and arrangement-related DC offsets are separated off, while on the other hand the actual DC components of the converted signal continue to be preserved for the demodulation.

The object is achieved by a receiver having the features of claim 1 and a process having the features of claim 4.

The homodyne receiver according to the invention exhibits for the received signal a signal divider with which the signal is guided into two signal branches. A local oscillator with a direct and a phase-shifted output (90°) is provided. The outputs of the local oscillator lead to mixers, disposed in the signal branches, for generating the I and Q signals. In the two signal branches, bandpass filters are provided for the suppression of undesired mixing products, carrier residues and DC offsets. Expediently, signal amplifiers are additionally disposed in the two signal branches. The two signal branches are fed to a computer system, preferably a digital signal processor (DSP). Suitable analog/digital converters are expediently disposed between the signal amplifiers and the DSP. The AD conversion can however also take place in the computer system itself.

According to the invention, the local oscillator used exhibits a frequency offset from the carrier frequency of the received signal. In the case of hitherto conventional receivers, attempts were made to avoid this as far as possible. In some cases, costly control loops were even used in order to tune the frequency of the local oscillator as precisely as possible to the carrier frequency. Compared with this, the invention provides an opposite teaching. Bandpass filters are intended to be disposed and the frequency of the local oscillator is intended to differ from the carrier frequency to such an extent that the actual DC components of the converted signal which would nominally be at the carrier frequency are raised into the pass band of the bandpass filters. Expressed in different terms, the frequency offset is intended to be selected so that it lies within the pass band of the bandpass filters. Accordingly, what matters is not any random offset of the frequency of the local oscillator from the carrier frequency, but that the frequency offset of the local oscillator from the carrier frequency is tuned to the lower pass band of the bandpass filters. On the other hand, however, the frequency of the local oscillator is to be located within the spectrum of the signal to be received, in order not unnecessarily to reduce the blocking interval to the neighboring channel.

As a result of the frequency offset of the local oscillator, the spectrum of the converted signal existing downstream of the mixers is displaced by the frequency offset. As a result. of the dimensioning rule according to the invention for the frequency offset, the actual DC component of the converted signal is not separated off with the DC offset. As a result of the selection, according to the invention, of the frequency of the local oscillator in conjunction with the thus executed AC coupling, advantageously the dynamic range for the AD converter is restricted, without losing information on the modulating signal.

As a result of the frequency offset, set according to the invention, of the local oscillator, a distortion of the demodulated signal is intentionally set. This also leads in a direction opposite to the former mode of procedure. The distortion generated by the frequency offset can, in comparison with the remaining distortions, which are separated off by the bandpass filter, be compensated relatively easily in the computer system. As a result of the combination, according to the invention, of an AC coupling on the one hand and the intentional setting of a frequency offset of the local oscillator on the other hand, distortions which are difficult to separate off are replaced by a compensatable distortion. It is possible to use economic AD converters having a dynamic range which is adapted to the dynamic range of the useful signal.

In principle, the frequency offset (difference between frequency of the local oscillator and the carrier frequency) must be located within the pass band of the bandpass filter. The frequency offset must therefore be located between the lower limit frequency and the upper limit frequency of the bandpass filter. Since, with the frequency offset, not only is the DC component of the baseband signal raised, but this applies to all frequencies of the baseband signal, the frequency offset must be selected so that even the greatest (offset) frequency of the baseband signal which is to be expected lies within the pass band of the bandpass filter. It is furthermore necessary to observe the blocking range between neighboring transmission channels. Assuming an ideal bandpass filter, the maximum frequency offset can assume one half of the value of the difference between the channel center spacing and the channel width employed. In the case of a real bandpass filter, the frequency offset must be smaller, as a function of the edge gradient. The edge gradient at the lower limit frequency of the bandpass filter also determines the minimum required frequency offset of the local oscillator.

In the case of the specifically intended applications of the receiver according to the invention for modern mobile radio networks, stringent restrictions for channel center spacing and channel width are prescribed. Typically, the channel width may amount to 60% of the channel spacing. For example, in the case of a channel spacing of 12.5 kHz with a channel width of 7.5 kHz, the maximum frequency offset can amount to 2.5 kHz using ideal filters. Accordingly, a part of the spectrum is admittedly lost as a result of the bandpass filter, but the information on the actual DC component, which information is more important for demodulation, continues to be preserved.

The homodyne receiver according to the invention exhibits a computer system which is designed for the compensation of the distortion generated by the constant frequency offset of the local oscillator from the carrier frequency.

The distortion generated according to the invention due to the frequency offset is recognizable as an additional steady phase change of the modulated signal. Demodulation can take place, for example, according to the process described in GB 2 192 506. The compensation for the additional steady phase change generated by the constant frequency offset can take place, for example, by means of piece-by-piece mean value formation. In the case of modulation with digital information, the distortion, generated by the constant frequency offset, of the demodulated signal can be determined as the gradient of a compensating straight line in the phase-time graph and compensated for.

According to the process according to the invention, the received signal is mixed with a frequency which differs from the carrier frequency by an intentionally set, specified amount, whereby intentionally a distortion of the demodulated signal is generated. Using a bandpass filter, the causes of the intentionally generated distortions are transmitted, whilst further distortions such as undesired DC offsets, but also undesired mixing products and carrier residues, are separated off. To this end, the baseband signal is displaced by the amount of the frequency offset in particular by,the intentionally set frequency offset, in which case the latter is selected so both it and the displaced converted signal, are within the pass band of the bandpass filter.

In particular, the converted baseband is displaced on account of the frequency offset by an amount which is smaller than one half of the value of the difference between the channel center spacing and the channel width employed.

According to the invention, the baseband signal which is displaced by the frequency offset is digitized, demodulated in a digital signal processor and corrected in such a manner that the distortion generated by the frequency offset is compensated. The compensation for distortion, recognizable in the baseband as a steady additional phase change, due to the frequency offset, takes place for example, by piece-by-piece mean value formation with subsequent subtraction. In the case of a modulation with digital information, the distortion generated by the frequency offset is determinable as the gradient of a compensating straight line in the phase-time graph and can thus be compensated.

BRIEF DESCRIPTION OF THE DRAWINGS

An illustrative embodiment of the,process according to the invention is explained with reference to the diagrammatic representation in FIG. 1.

DETAILED DESCRIPTION OF THE INVENTION

Figure 1:
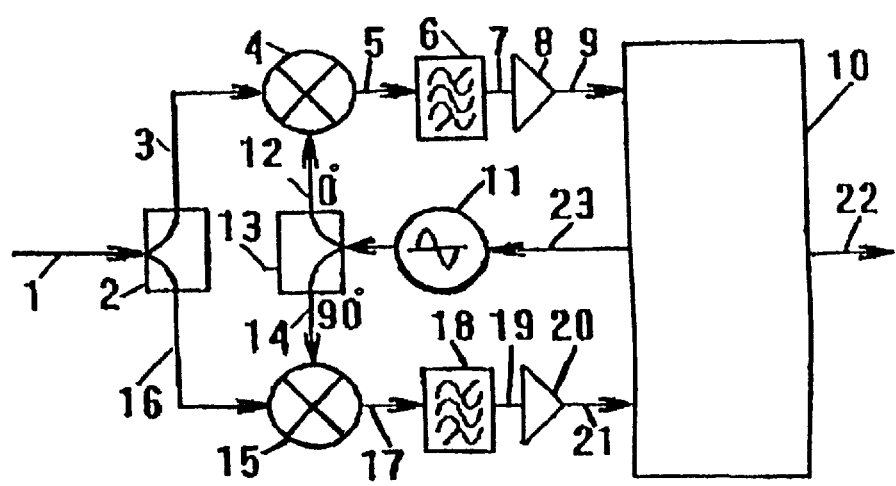
FIG. 1 shows, in diagrammatic representation, a block diagram of a homodyne receiver with a downstream computer system.

Via the line 1, the received signal is fed to a signal divider 2. In the signal divider 2, the received signal is split into a first component and a second component. The first component is fed via the line 3 to a mixer 4. In the mixer 4, the first signal part is mixed with the signal present at the direct output 12 of the local oscillator 11. As a result of this, the in-phase signal (I) arises at the mixer 4. This signal is fed via the line 5 to the bandpass filter 6. There, undesired mixing products, carrier frequency residues, but also DC offsets are separated off. The filtered signal is fed via the line 7 to a signal amplifier 8. The amplified signal is fed via the line 9, if required after interposition of an AD converter, to the computer system 10. The second signal part generated in the signal divider 2 is fed via the line 16 to the mixer 15. In the mixer 15, the signal of the local oscillator 11, which signal is present at the output 13 of the local oscillator 11 and is fed via the line 14 and is phase-shifted by 90°, is mixed with the second signal part fed via the line 16. The mixing product, which is designated as the quadrature signal (Q), is fed via the line 17 to the bandpass filter 18. The function of the bandpass filter 18 corresponds to that of the above described bandpass filter 6. The filtered Q signal is passed via the line 19 to a signal amplifier 20. From here, if required after analog/digital conversion (not shown), it is fed via the line 21 into the computer system 10. The demodulation by means of the I and Q signals is executed in the computer system 10. In this case, the demodulated signal per se arises, but this is still distorted on account of the frequency offset, provided according to the invention, of the local oscillator. In the phase-time graph, the distortion is recognizable, for example where the modulating signal is speech, as a steady superposed rise in the phase-time graph. This steady rise is determined in the computer system by portionwise mean value formation and can then be compensated (subtracted). The demodulated, distortion-cleared signal is fed via the line 22 to further assemblies.

In a particular design, it can be provided that the local oscillator 11 can be regulated in order to permit "spread spectrum" applications. For this purpose, a control line 23 can lead from the computer system 10 to the local oscillator 11. In this case also, the frequency offset provided according to the invention is preserved.

I claim:

1. Homodyne receiver having a signal divider, a local oscillator with a direct and a phase-shifted output, having two mixers for generating I and Q signals, two bandpass filters for the suppression of undesired mixing products, carrier residues and DC offsets, two signal amplifiers and a computer system for removal of distortion, in which the local oscillator (11) has a frequency offset in relation to the carrier frequency of a received signal, so that the difference frequency between carrier frequency and oscillator frequency lies within the pass band of the bandpass filters (6, 18), characterized in that the difference frequency between carrier frequency and oscillator frequency is smaller than one half of the value of the difference between the channel center spacing and the channel width employed.

2. Homodyne receiver according to claim 1, characterized in that the computer system (10) is designed for a removal of the steady phase change of the modulated signal, which phase change is generated by a constant frequency offset.

3. Homodyne receiver according to claim 1, characterized in that the local oscillator (11) can be regulated for setting two differing carrier frequencies.

4. Process for direct conversion, comprising the steps of (a) splitting a received signal into first and second signal branches, (b) mixing the first signal branch with the signal of a local oscillator, (c) mixing the second signal branch with the signal, displaced by 90°, of the local oscillator, (d) bandpass filtering, (e) amplifying, (f) AD conversion, and (g) demodulation, as well as removal of distortion in a computer system, wherein the signals of both signal branches are raised by an intentionally set frequency offset of the local oscillator from the carrier frequency by the difference amount in the pass band of the bandpass filters, and wherein the thereby arising distortion of the modulated signal takes place in the computer system, wherein a frequency shift takes place by an amount which is smaller than one half of the value of the difference between the channel center spacing and the channel width employed.

* * * * *